(12) United States Patent
Ros Marín (10) Patent No.: US 10,893,782 B2
(45) Date of Patent: Jan. 19, 2021

(54) HAND DRYER COMPRISING A DETECTION VOLUME

(71) Applicant: FFUUSS 2013, S.L., Solana-Lleida (ES)

(72) Inventor: Óscar Ros Marín, Solana-Lleida (ES)

(73) Assignee: FFUUSS 2013, S.L., Solana-Lleida (ES)

( * ) Notice: Subject to any disclaimer, the term of this patent is extended or adjusted under 35 U.S.C. 154(b) by 159 days.

(21) Appl. No.: 16/300,052

(22) PCT Filed: May 9, 2017

(86) PCT No.: PCT/ES2017/070291
§ 371 (c)(1),
(2) Date: Nov. 8, 2018

(87) PCT Pub. No.: WO2017/194806
PCT Pub. Date: Nov. 16, 2017

(65) Prior Publication Data
US 2019/0142230 A1    May 16, 2019

(30) Foreign Application Priority Data
May 9, 2016    (ES) .................................. 201630584

(51) Int. Cl.
*F26B 5/04*       (2006.01)
*A47K 10/48*   (2006.01)
(Continued)

(52) U.S. Cl.
CPC ........... *A47K 10/48* (2013.01); *H03K 17/955* (2013.01); *H05B 1/0297* (2013.01)

(58) Field of Classification Search
CPC ..... A47K 10/04; H03K 17/955; H05B 1/0297
(Continued)

(56) References Cited

U.S. PATENT DOCUMENTS 6,951,081 B2 * 10/2005 Bonshor ................ H02G 3/088
52/302.1
2013/0139400 A1    6/2013 Fukano
(Continued)

FOREIGN PATENT DOCUMENTS

EP    2957205 A1    12/2015
ES    1106784 U    4/2014
(Continued)

OTHER PUBLICATIONS

Wikipedia, Surface Capacitance, 2015, Wikipedia, https://en.wikipedia.org/wiki/Capactive_sensing.*
(Continued)

*Primary Examiner* — John P McCormack
(74) *Attorney, Agent, or Firm* — Cantor Colburn LLP (57) ABSTRACT

Hand dryer having volume for receiving the hands delimited by two facing walls and provided with blow holes, an opening delimiting the volume by its sides superior and lateral, the walls being provided in their part opposed to the volume for receiving the hands with a fence delimiting a volume wherein air is injected blown before its ejection by the holes, each one of the fences including an upper wall, two lateral walls and a lower wall, the hand dryer being provided with means for detecting the introduction of hands in the volume, wherein the detecting means include a capacitive detector made of at least a continuous conductive element which runs in the vicinity of the upper and lateral walls of one of the fences.

13 Claims, 11 Drawing Sheets

(51) Int. Cl.
  *H03K 17/955* (2006.01)
  *H05B 1/02* (2006.01)
(58) Field of Classification Search
  USPC .......................................................... 34/413
  See application file for complete search history.

(56) References Cited

U.S. PATENT DOCUMENTS

2017/0007081 A1* 1/2017 Homma ................. A47K 10/48
2018/0325270 A1* 11/2018 Purser .................. A47C 20/041

FOREIGN PATENT DOCUMENTS

| ES | 2495720 A1 | 9/2014 |
| FR | 1250988 A | 1/1961 |
| GB | 756554 A | 9/1956 |
| WO | 2007015036 A1 | 2/2007 |
| WO | 2011044247 A1 | 4/2011 |
| WO | 2015128989 A1 | 9/2015 |

OTHER PUBLICATIONS

International Search Report dated Jul. 19, 2017 re: Application No. PCT/ES2017/070291, pp. 1-4, citing: U.S. 2013139400 A1, WO 2015128989 A1, EP 2957205 A1 and ES 1106784 U.

* cited by examiner

HAND DRYER COMPRISING A DETECTION VOLUME

TECHNICAL FIELD

The present disclosure relates to a hand dryer that allows its use by children or people in wheelchairs and that does not involve appreciable modification of the components for the integration of the detecting means, that is, that does not involve redesigning the components. The disclosure also relates to a hand dryer that minimizes the drop of drops to the ground.

BACKGROUND

The hand dryer comprising a volume for receiving the hands are known. This volume is delimited by two facing walls and is provided with blow holes.

This volume is accessible by an opening delimiting the volume by its sides superior and lateral.

The walls are provided each in their part opposed to the volume for receiving the hands with a fence delimiting a volume wherein it is injected air blown before its ejection by the holes.

These fences, which are internal fences, comprise each an upper wall, two lateral walls and a lower wall.

These hand dryer also comprise means for detecting the introduction of hands in the volume.

Examples of these hand-dryers are those described in the documents with number of publication ES1106784U and ES2495720A1.

In the hand dryer of this type proximity sensors are incorporated without contact, as for example based on light barriers or in capacitive detectors, in the latter case as described in the documents WO2011044247A1, WO2007015036A, GB756554A.

In the hand dryers destined to dry the hands by introducing them in a cavity, of the type that are hung with the opening approximately at the level of the groin, it must be ensured that the children, the persons of short stature or the persons circulating in wheelchairs can also dry their hands. In general, the sensors are arranged on the upper side of the facing surfaces, and thus these users must make efforts to get the hand dryer started.

A solution to this need should be of easy installation, of low cost and that does not involve re-designing the parts of the hand dryer. The main parts are usually injected pieces, whose mold is also expensive. Therefore, a solution that does not imply modification or minimum modifications of the molds will be preferable.

The detecting means must be reliable, and should not be turned on unless someone has actually introduced the hands in the volume of detection.

It is also known that this type of hand dryer comprises a cavity for receiving the hands opened superiorly and laterally, such that an upper opening, a first lateral opening and a second lateral opening are defined, the cavity for receiving the hands being delimited by a first surface and a second surface provided with air blowing holes for drying the hands.

A major drawback of this type of hand dryer is that part of the water withdrawn from the hands by the jets of air that come out by the air blowing holes is projected in the form of drops by the mentioned side openings, which end in the floor.

If these devices are used continuously, for example in services of public places, the projected droplets make the soil dirty and present an unpleasant aspect. Therefore, another aspect addressed by the present application is to solve this drawback.

BRIEF SUMMARY

To overcome the drawbacks of the state of the art, the present disclosure proposes a hand dryer comprising a volume for receiving the hands, the volume being delimited by two facing walls and provided with blow holes, an opening delimiting the volume by its sides superior and lateral, the walls being provided each in their part opposed to the volume for receiving the hands with a fence delimiting a volume wherein air blown is injected before its ejection by the holes, each one of the fences comprising an upper wall, two lateral walls and a lower wall, the hand dryer being provided with means for detecting the introduction of hands in the volume, wherein the detecting means comprise a capacitive detector made of at least a continuous conductive element which runs in the vicinity of the superior and lateral walls of one of the fences.

In this way it is possible to detect the introduction of hands by any zone of the opening. This allows very advantageously people who for some reason cannot introduce the hands superiorly, introduce them laterally, as is the case of children, or of people who go in a wheelchair. In addition, the continuous conductive elements can be integrated in the hand dryer without the need to modify the components thereof.

In some embodiments, the hand dryer comprises a second continuous conductive element which runs in the vicinity of the superior and lateral walls of the other fence.

In this way, symmetry is guaranteed in the detection with respect to the plane that divides in two the volume of detection.

In some embodiments, the continuous conductive element(s) are cables.

In other embodiments, the continuous conductive elements are a succession of cables and plates.

In some embodiments, the continuous conductive elements are plates. That is to say, that the capacitor can be implemented with metallic strips, which will surround the fence in a suitable way to allow detection in the opening.

In some embodiments, the conductive elements are arranged in the side of the fences opposite to the volume wherein air blown is injected before its ejection by the holes.

This solution allows to isolate the cables from the interior of the cavity where air is blown.

It can also be arranged by the internal side, although this would imply having to make holes in the fence to give input and output to the conductive elements. It could also be made mixed if necessary to standardize the detection. In any case, the preferred arrangement is by the outside.

In some embodiments, the walls comprise, adjacent to the fences and in the external face of the fences, cylindrical protrusions for attaching a complementary cover, the continuous conductive elements being pressed between the cylindrical protrusions and the fences.

In some embodiments, the fences are provided on their external surface with ribs arranged in the vicinity of the cylindrical protrusions. These ribs contribute to the fixation of the cables.

In some embodiments, the continuous conductive elements are connected therebetween such that they constitute one of the conductive surfaces of the capacitive detector.

In some embodiments, the hand dryer comprises a microcontroller configured for detecting a change in the capacitance of the capacitive detector higher than a determined threshold value.

In some embodiments, the microcontroller is configured for detecting the change in the capacitance by measuring the charge and discharge times of the capacitive detector.

Finally, the hand dryer does not comprise specific screening elements.

The disclosure also relates to a hand dryer of the type comprising a cavity for receiving the hands opened superiorly and laterally, such that an upper opening, a first lateral opening and a second lateral opening are defined, the cavity for receiving the hands being delimited by a first surface destined to be placed closer to the user and a second surface destined to be placed closer to a supporting wall of the hand dryer, the surfaces comprising air blowing holes for drying the hands, wherein the air blowing holes of the first surface closest to the lateral openings are arranged closer to the lateral openings than the air blowing holes of the second surface closest to the lateral openings, such that said holes of the first surface arranged closer to the lateral openings do not have air blowing holes arranged in front of them, thus allowing that the air injected by said holes arranged closer to the lateral openings constitute air curtains that minimize or prevent the projection of drops of water towards the outside by said lateral openings, wherein the portions of the second surface closest to the lateral openings are curved such that they direct the air coming from said holes of the first surface arranged closer to the lateral openings towards the middle part of the cavity for receiving the hands.

In this way, any drop that is dragged by the air curtain will impact in a surface inclined towards the central part of the cavity, improving the effectiveness of the air curtain. That is, two combined effects are produced. First of all the drops that hit will bounce in a direction opposite to the direction of exit by the lateral openings. In the second place, the air of the curtain will be deflected by the interior of the cavity. The combined effect is a substantial improvement in the effectiveness of the air curtain, i.e. a reduction in the amount of water exiting by the lateral openings.

By portions closer to the vertical openings, a band of surface of substantially vertical extension should be understood, although it may be slightly inclined to favor dragging of the drops downwards, a band which is adjacent to the corresponding lateral opening.

In some embodiments, the air blowing holes closer to the lateral openings that do not have blowing holes in front of them are arranged in vertical rows.

In some embodiments, the air blowing holes closer to the lateral openings that do not have blowing holes in front of them have an oblong section with the major axis in the vertical direction.

In some embodiments, the air blowing holes extend by the side of the surfaces opposite to the cavity for receiving the hands by means of air injection channels.

In some embodiments, the channels corresponding to the holes of the first surface arranged closer to the lateral openings have a horizontal axis.

In some embodiments, the second surface is tilted towards the user, such that the air injected by the air blowing holes is directed downwards.

This feature, combined with the air channels of the horizontal holes, allows to direct the drops downwards.

Finally, in some embodiments, the channels corresponding to the holes of the first surface arranged closer to the lateral openings have a length greater than the remaining holes.

In this way, the air flow of the curtains is channeled better than the central air flow, such that the performance of the air curtain is improved.

BRIEF DESCRIPTION OF THE DRAWINGS

To complement the description and to assist with a better understanding of the features of the disclosure, in accordance with an example of practical embodiment thereof, an integral set of the description, a set of figures wherein with illustrative character and not limiting, the following has been represented.

DETAILED DESCRIPTION

Figure 1:
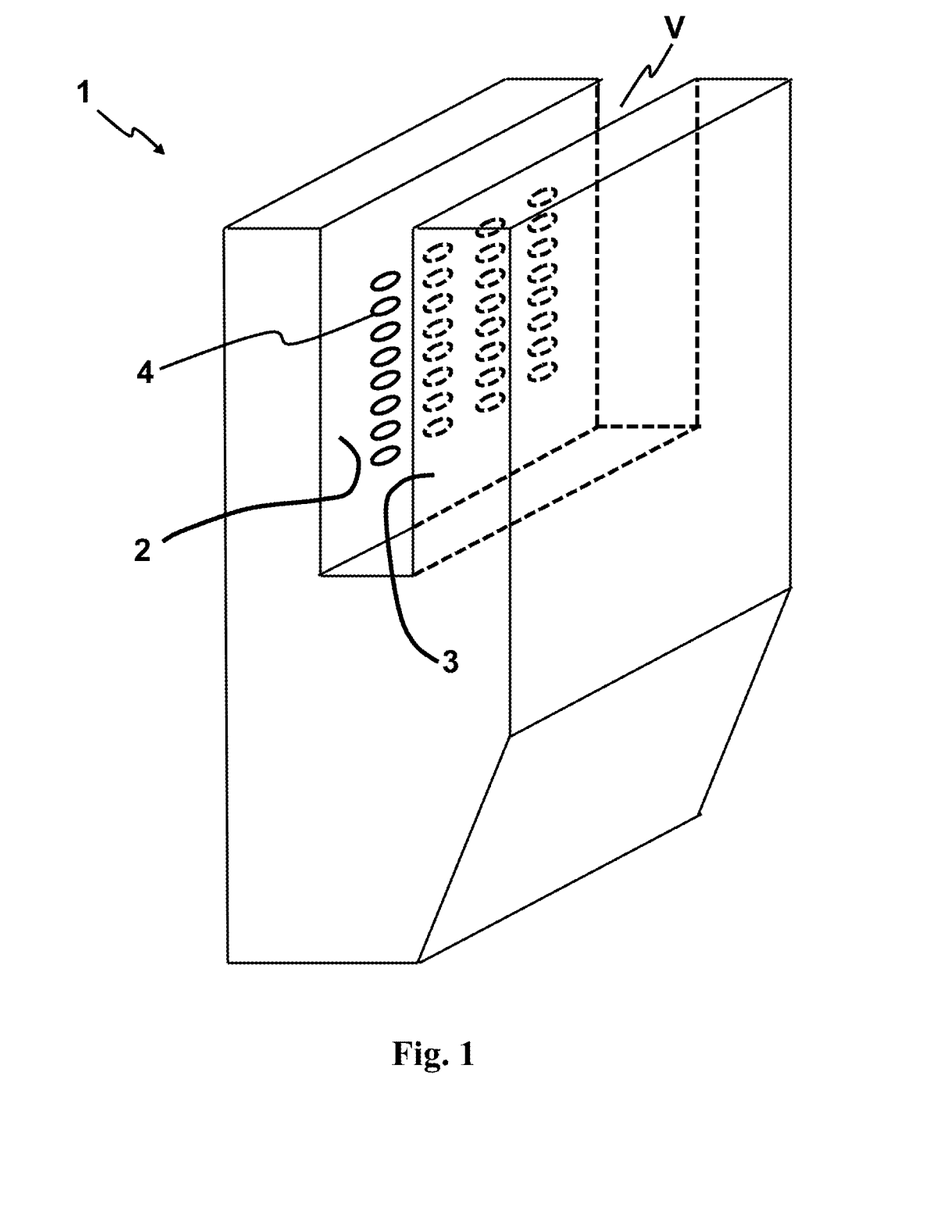
FIG. 1 is a schematic perspective of the hand dryer, when mounted.
Figure 2:
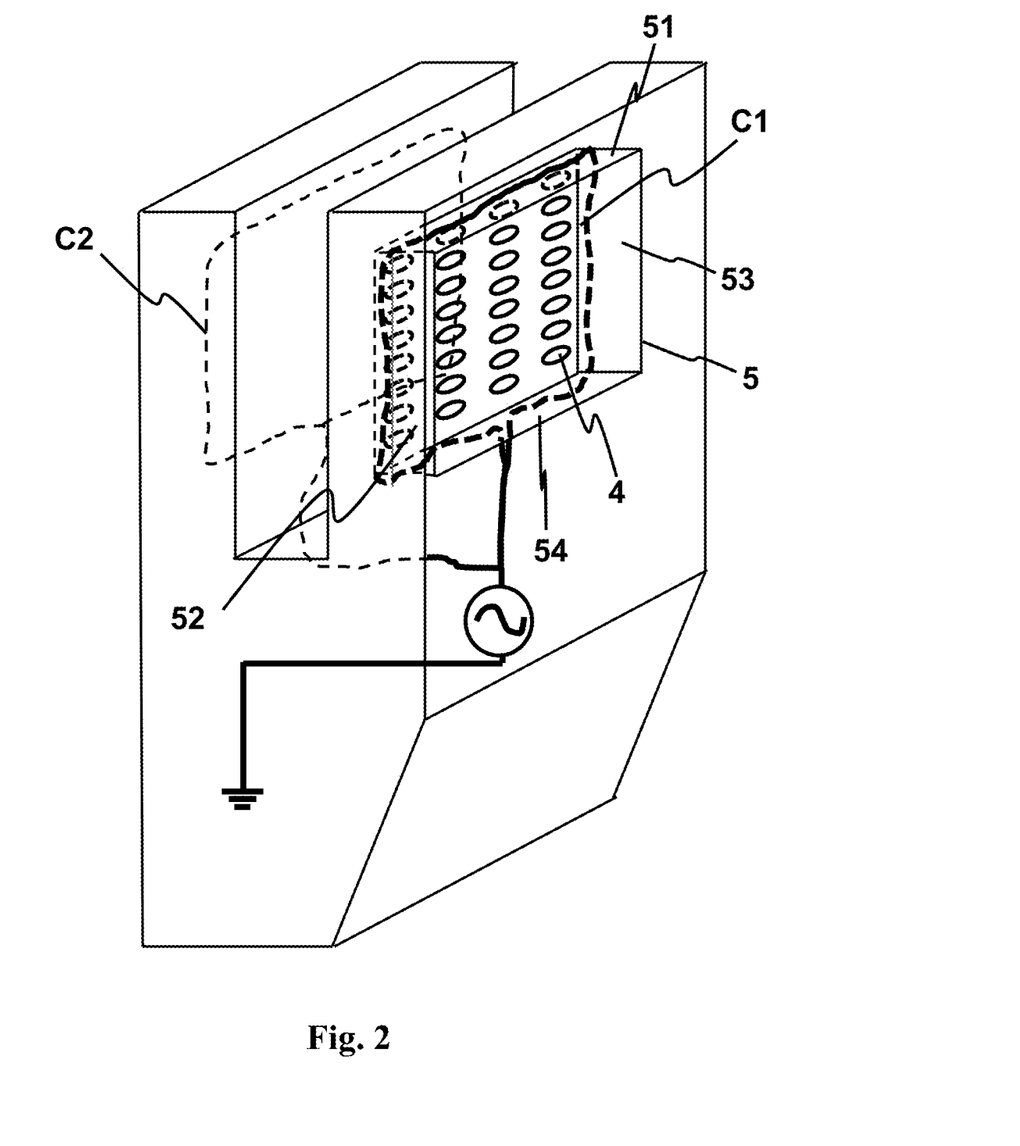
FIG. 2 is a schematic perspective of the hand dryer, but to which the front cover has been removed such that the fence is shown.
Figure 3:
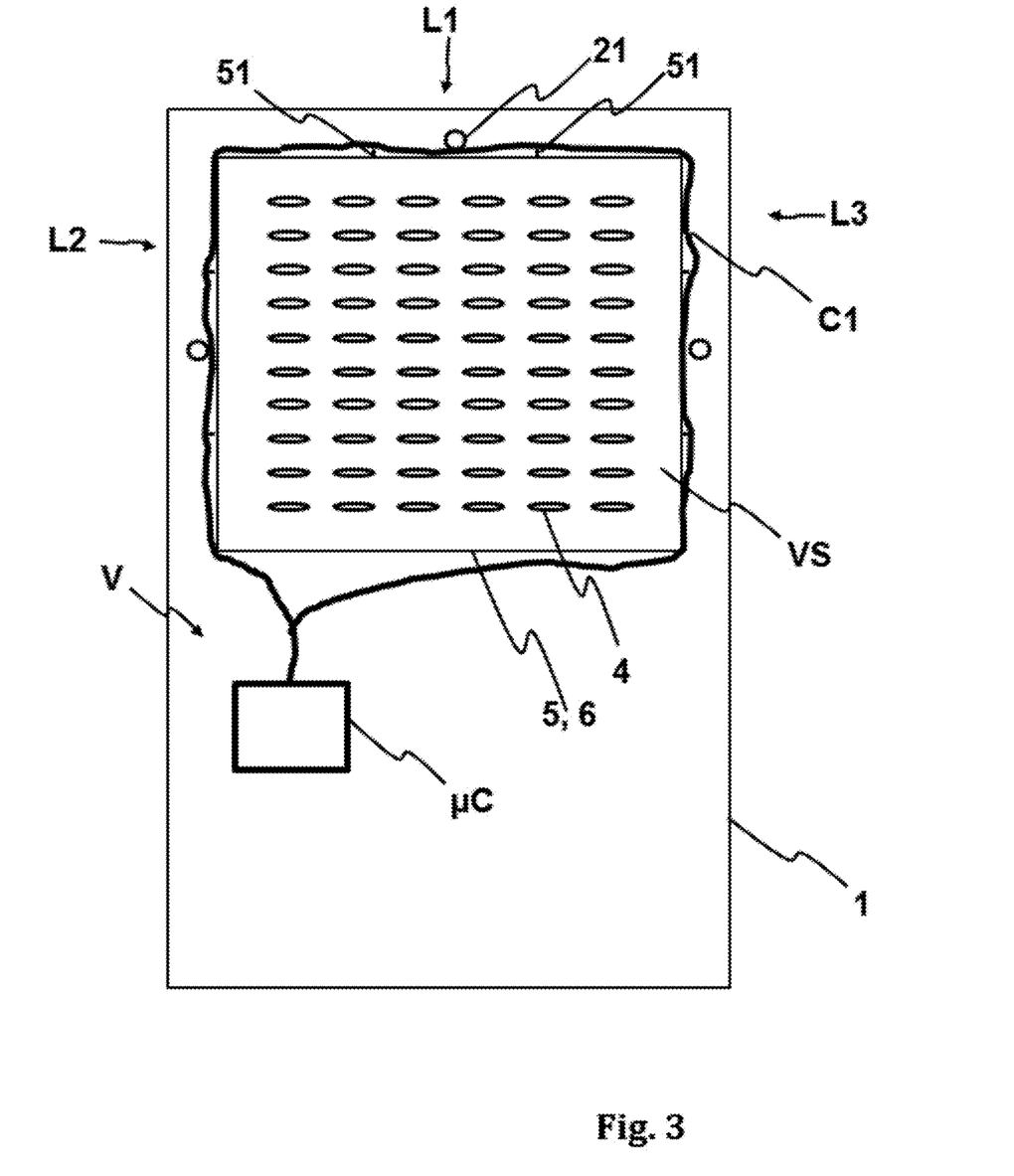
FIG. 3 is a schematic elevational view of a hand dryer to which the front cover has been removed, such that the arrangement of its components can be seen.
Figure 4:
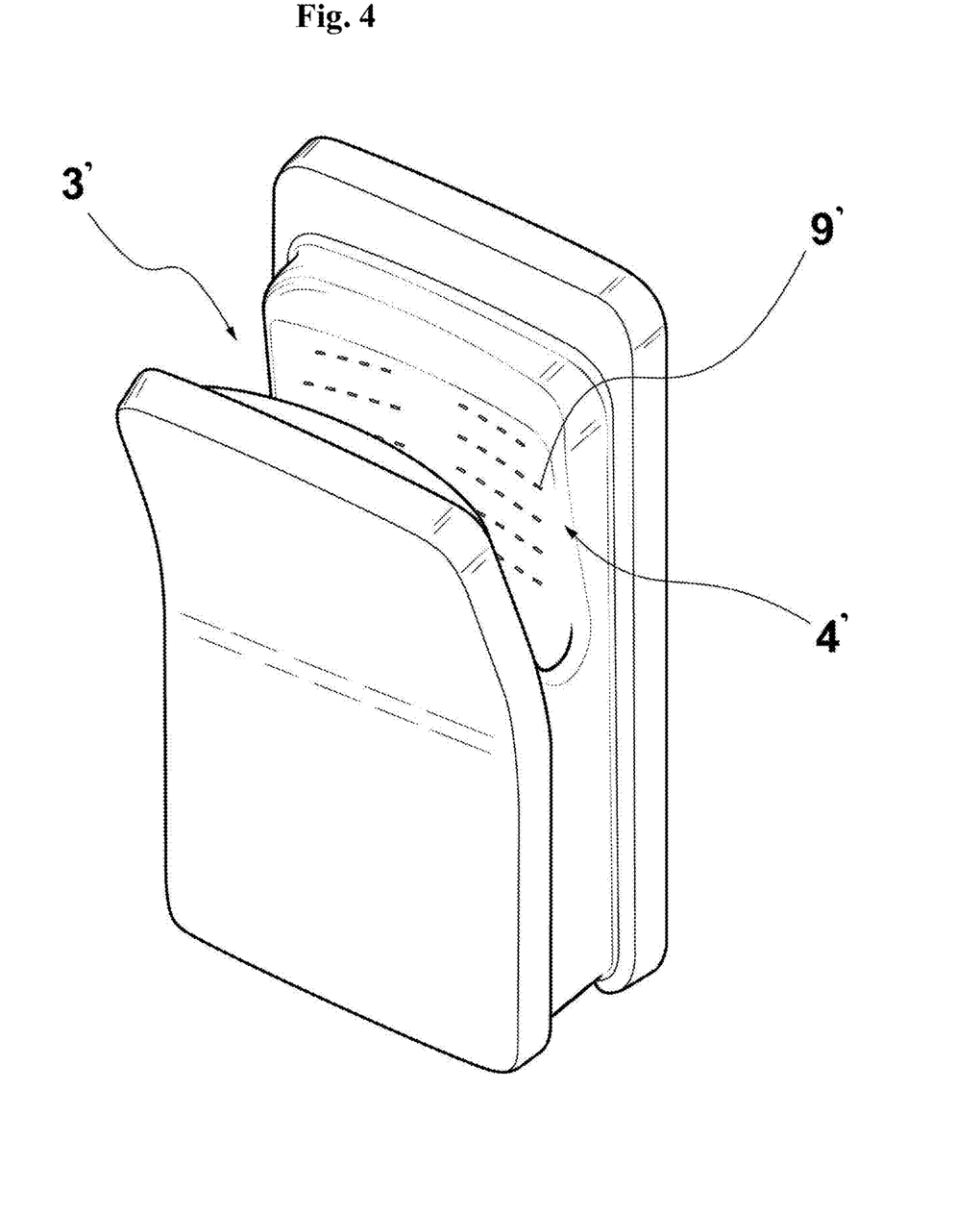
FIG. 4 is a perspective view of a hand dryer according to the disclosure.
Figure 5:
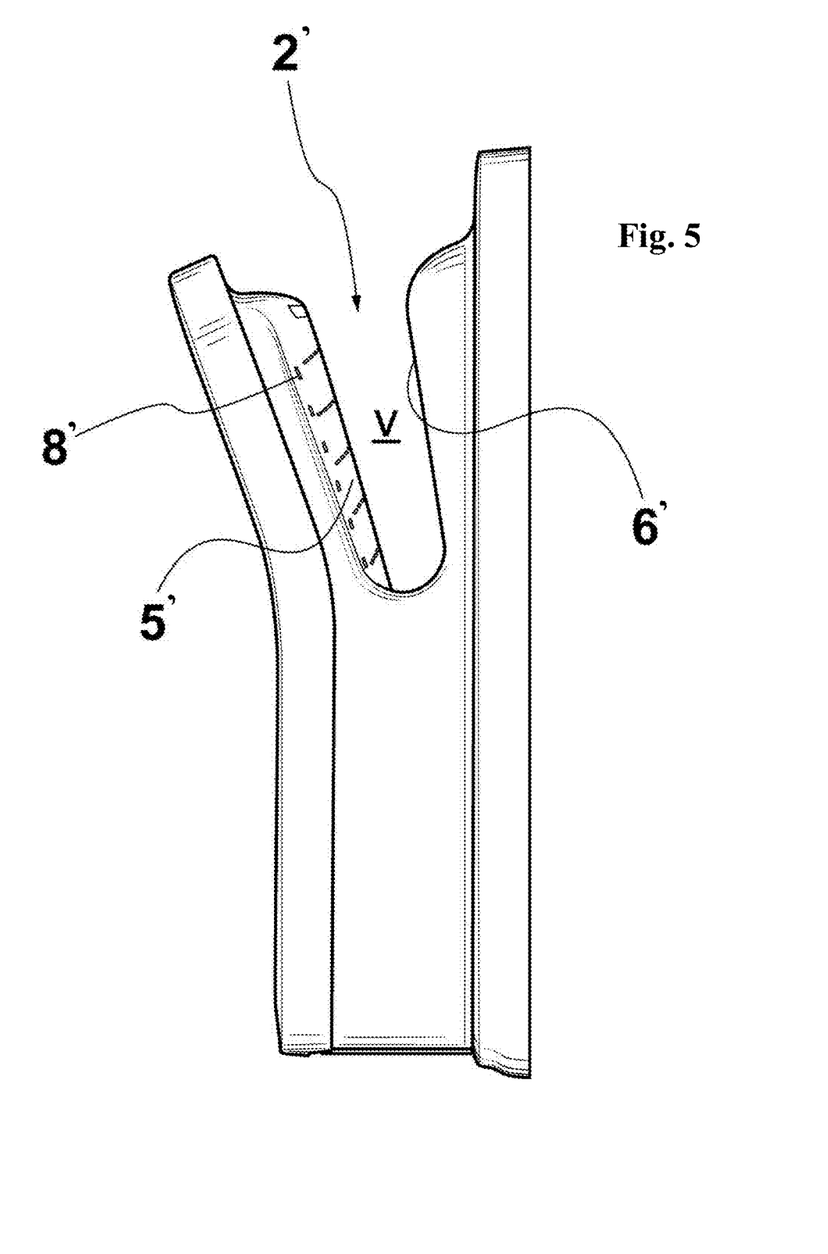
FIG. 5 is a side elevational view of the hand dryer.
Figure 6:
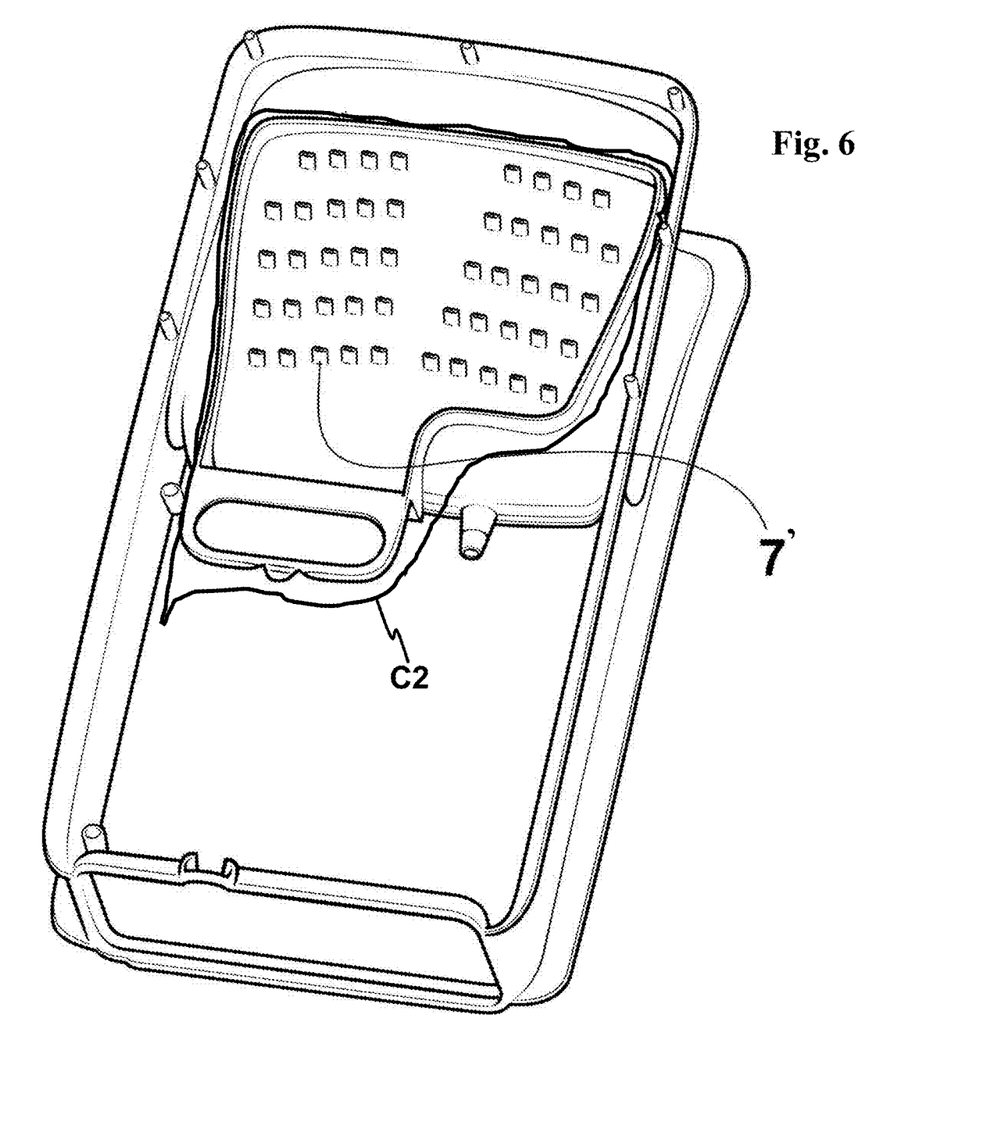
FIG. 6 shows the piece comprising the surfaces provided with holes on the side that does not have the lateral holes of production of the air curtains.
Figure 7:
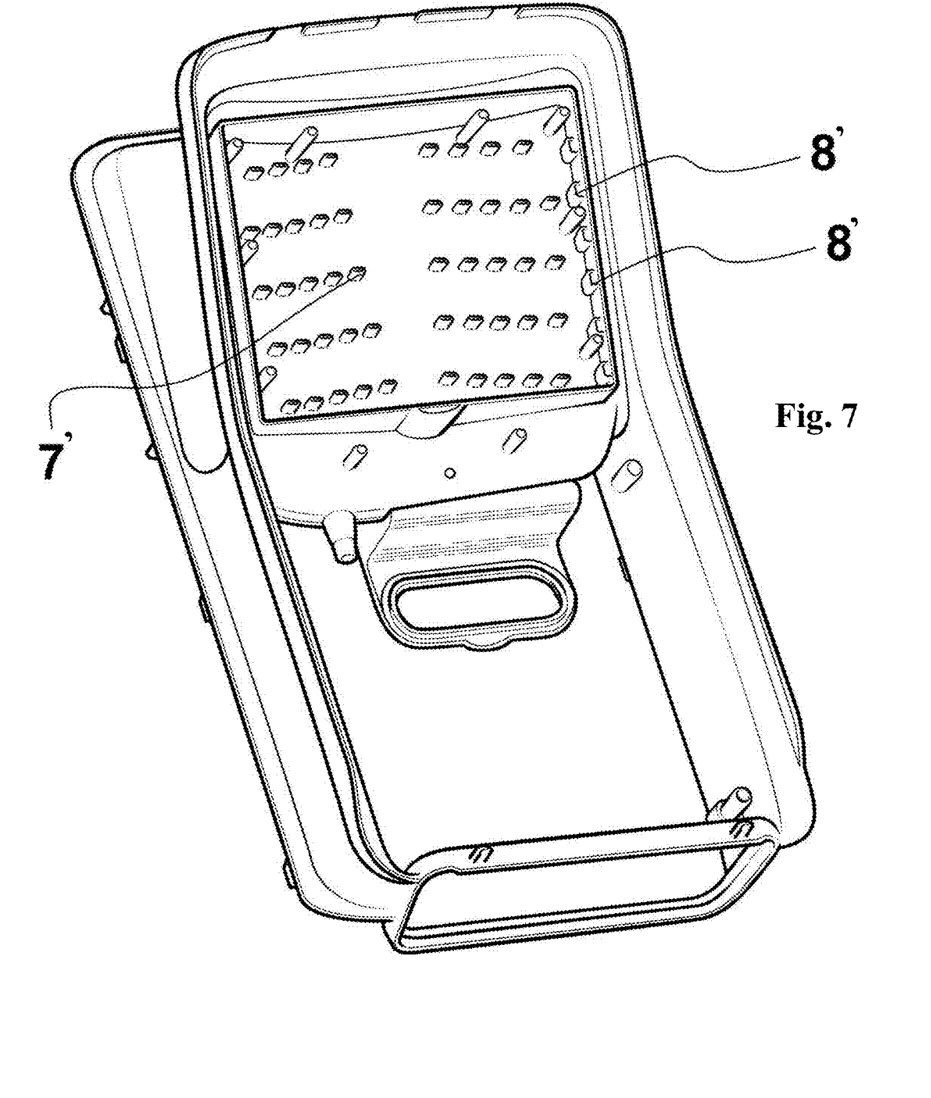
FIG. 7 shows the piece comprising the surfaces provided with holes on the side that has the lateral holes of production of the air curtains.

As seen in FIGS. 1 to 3, the present disclosure relates to a hand dryer 1 comprising a volume V for receiving the hands.

This volume V is delimited by two facing walls 2, 3 and provided with blow holes 4, an opening delimiting the volume V by its superior L1 and lateral L2, L3 sides.

In general, these hand dryer are designed for a user to approach frontally and enter their hands by the upper opening.

Internally, the walls 2, 3 are provided each in their part opposed to the volume V for receiving the hands with a fence 5 delimiting a volume VS wherein air blown is injected before its ejection by the holes 4.

The fences comprise each an upper wall 51, two lateral walls 52, 53 and a lower wall 54. These fences are implemented in many ways in the different models of hand dryer, and aim to distribute the air coming from the fan to all the blow holes.

Therefore, this fence is delimited by the side of the drying volume V by the wall provided with holes 4, and by the other side by a cover, which has not been shown. This cover can be an internal cover, that is to say that it will be covered by the external housing, or it can be conceived that the housing itself covers the volume or incorporates a cover attached to the housing.

E1 hand dryer 1 is provided with means for detecting the introduction of hands in the volume V.

In particular, according to the present disclosure, the detecting means comprise a capacitive detector made of at least a conductive cable C1 which runs in the vicinity of the superior 51 and lateral 52, 53 walls of one of the fences 5.

It is a very simple solution that allows detection by the entire perimeter of the opening. Therefore, if a person of low stature, such as a child, enters the hands laterally, then the hand dryer will be activated equally.

Furthermore, as can be seen in the figures, it is sufficient to add the conductive elements, that is, that it is not necessary to make modifications in the parts that make up the hand dryer.

The conductor must surround the holes area, area that is delimited by the fence, and therefore the manufacturer should only arrange the conductive elements surrounding it, or arranging them adjacent to it. The disclosure embraces, of course, the arrangement of the conductive elements in the space between the outer shell and the fence, since they are usually in the vicinity.

The conductive elements can also be arranged by the internal wall of the fence, if the space in the external part is not enough. However, it is a minor solution that would involve putting a cable gland in the fence.

As seen in FIG. 2, according to an especially preferred embodiment, the hand dryer comprises a second continuous conductive element C2 which runs in the vicinity of the superior 51 and lateral 52, 53 walls of the other fence 6, represented superimposed on the first one in FIG. 3. In this way the conditions of detection in the opening are equally distributed, as it is thus symmetrical.

As seen in the FIGS. 2 and 3, the conductive elements are arranged in the side of the fences opposite to the volume VS wherein air blown is injected before its ejection by the holes 4. As mentioned, it can also be arranged by the internal side, although this would imply to make holes in the fence to give input and output to the conductive elements. The two solutions could also be combined if necessary to make the detection uniform. In any case, the preferred arrangement is by the outside.

As seen in FIG. 3, the walls 2, 3 comprise, adjacent to the fences 5, 6 and by the external part of the fences 5, 6, cylindrical protrusions 21 for attaching a complementary cover, the continuous conductive being elements C1, C2 pressed between the cylindrical protrusions 21 and the fences 5. Also it is foreseen than the fences 5, 6 comprise on their external surface stiffeners/ribs 51 arranged in the vicinity of the cylindrical protrusions 21. These ribs contribute to the fixation of the cables, cooperating with the cylindrical protrusions.

As shown in FIG. 3, the continuous conductive elements are attached to the fences 5 or to the internal surface of the walls 2, 3 and in the vicinity of the fences 5, 6 by means of special dedicated outlets and/or guides molded in the fence or in the housing.

As shown in FIG. 2, the continuous conductive elements C1, C2 are connected therebetween such that they constitute one of the conductive surfaces of the capacitive detector. That is, one of the "plates" of the capacitor would be formed by two loops joined together, as if forming an "8" and placed under voltage.

As shown in FIG. 3, the hand dryer comprises a microcontroller μC configured for detecting a change in the capacitance of the capacitive detector higher than a determined threshold value. This microcontroller μC is configured for detecting the change in the capacitance by measuring the charge and discharge times of the capacitive detector.

The μC has a pin to manage the capacitive detector. This pin is of input/output. First it loads the capacitor plate "antenna in form of 8" with a constant current up to a voltage level, such that the pin of the microcontroller works as output. Then the microcontroller pin is configured as input and the discharge time is measured to manage the capacitive detector.

It is emphasized that unlike other state-of-the-art devices, such as that described in FR1250988, the hand dryer of the present disclosure does not comprise specific screening elements.

As illustrated by FIGS. 4 to 13, the disclosure also relates to a hand dryer 1' of the type comprising a cavity for receiving V' the hands opened superiorly and laterally, such that an upper opening 2', a first lateral opening 3' and a second lateral opening 4' are defined, the cavity for receiving the hands V' being delimited by a first surface 5' destined to be placed closer to the user and a second surface 6' destined to be placed closer to a supporting wall of the hand dryer, the surfaces being provided with air blowing holes 7' for drying the hands, wherein the air blowing holes 8' of the first surface 5' closest to the lateral openings 3', 4' are arranged closer to the lateral openings 3', 4' than the air blowing holes 9' of the second surface 5' closest to the lateral openings 4', 3', such that said holes 8' of the first 5' surface arranged closer to the lateral openings 3', 4' do not have air blowing holes arranged in front of them, thus allowing that the air injected by said holes 8' arranged closer to the lateral openings 3', 4' constitute air curtains F that minimize or prevent the projection of drops of water towards the outside by said lateral openings 3', 4.

Figure 12:
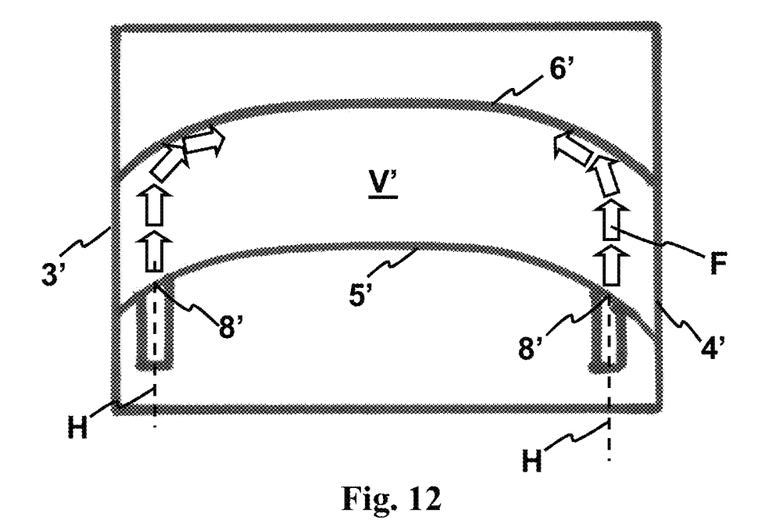
FIG. 12 shows schematically and by means of a horizontal plane section the effect of the curvature of the second surface, curved in such a way as to channel the flow F towards the interior.

Being these characteristics being known, according to the disclosure and as can be seen in FIG. 12, the portions of the second surface 6' in the vicinity of the lateral openings 3', 4' are curved such that they direct the air coming from said holes 8' of the first 5' surface arranged closer to the lateral openings 3', 4' towards the middle part of the cavity for receiving the hands V'.

Figure 9:
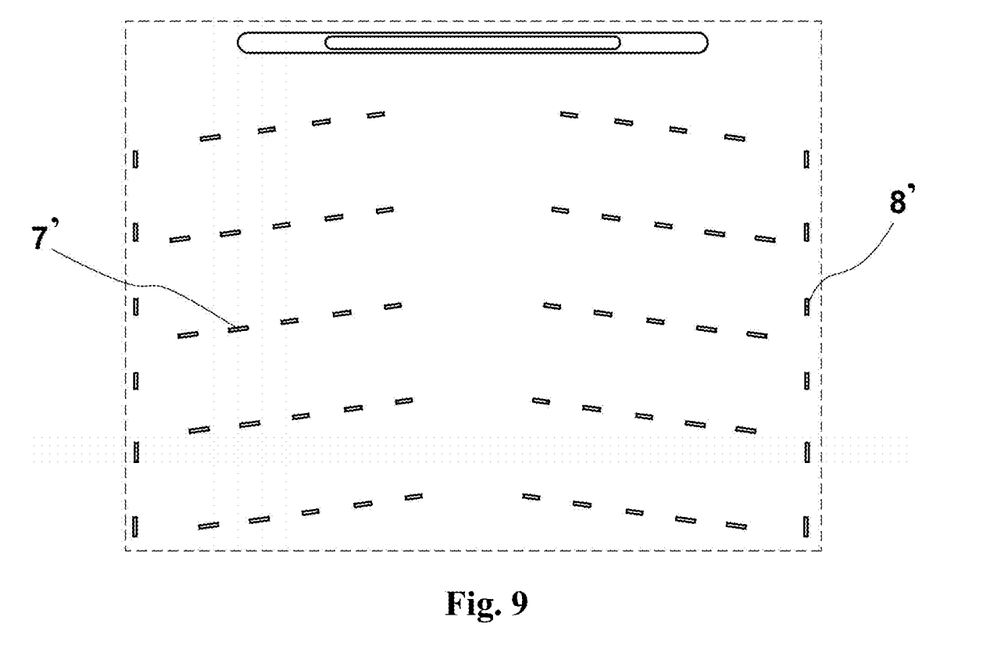
FIG. 9 is a front view of the surface comprising the lateral holes of formation of air curtain. The normal holes of drying are also shown.
Figure 10:
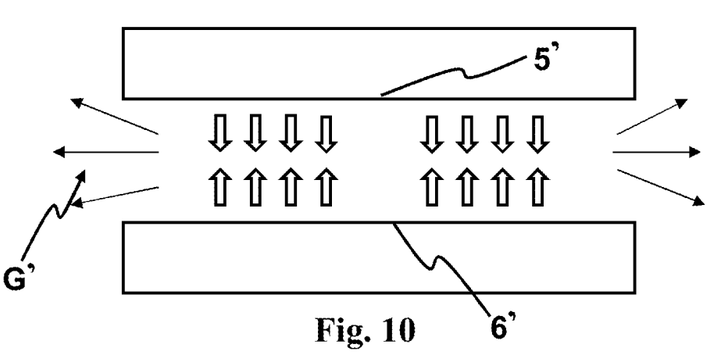
FIG. 10 schematically shows the effect of projection of drops of a known hand dryer.
Figure 11:
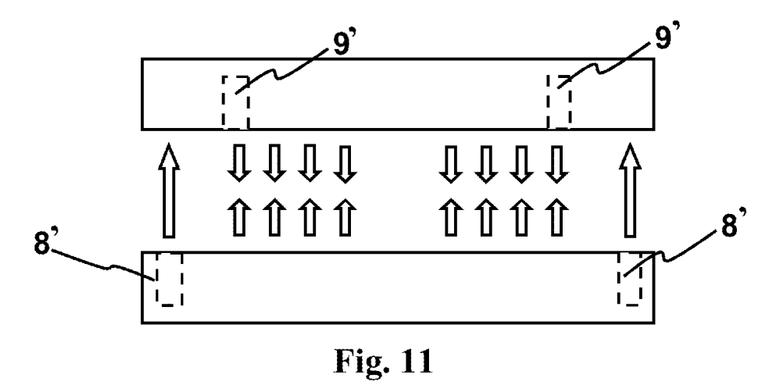
FIG. 11 shows schematically the effect of an air curtain of a hand dryer according to the present disclosure.

As can be seen in FIG. 9, the air blowing holes 8' closer to the lateral openings 3', 4' that do not have blowing holes in front of them are arranged in vertical rows.

Also as can be seen in FIG. 9, the air blowing holes 8' closer to the lateral openings 3', 4' that do not have blowing holes in front of them have an oblong section with the major axis in the vertical direction.

Figure 8:
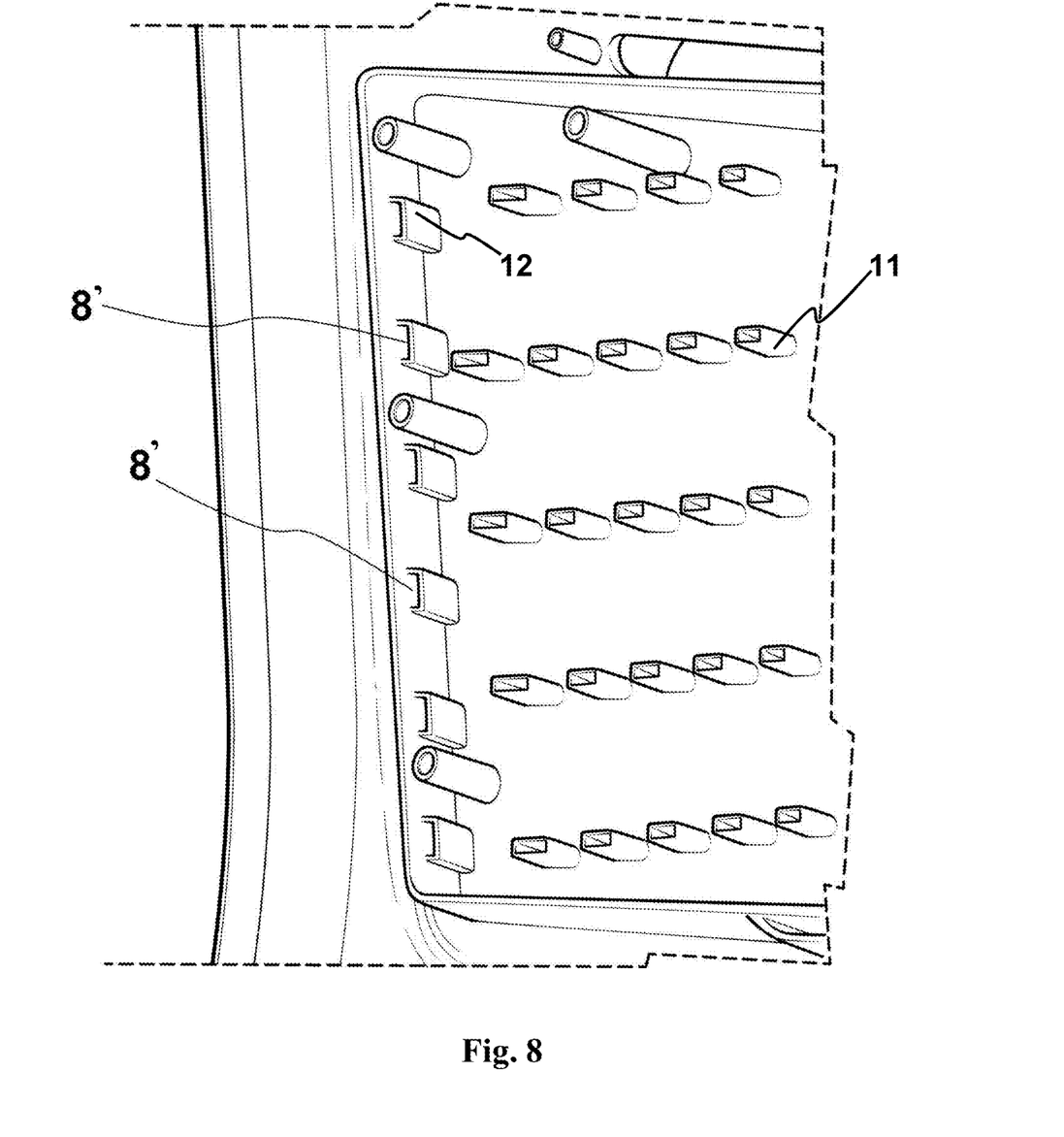
FIG. 8 is an in detail view showing the arrangement of the oblong holes of formation of air curtain arranged vertically in row.

As can be seen in FIG. 8, the air blowing holes extend by the side of the surfaces opposite to the cavity for receiving the hands V' by means of air injection channels 11, 12.

Preferably, the channels 12 corresponding to the holes 8' of the first 5' surface arranged closer to the lateral openings 3', 4' have an horizontal axis, as indicated by the dotted lines H, which represent a horizontal direction.

Figure 13:
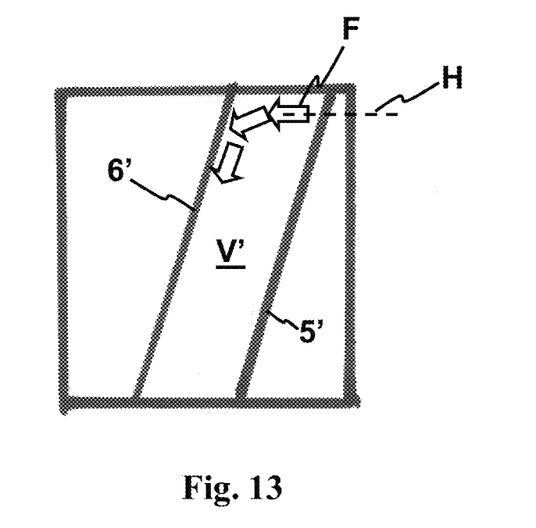
FIG. 13 shows schematically and by means of a vertical plane section the effect of the inclination of the second surface, curved in such a way as to channel the flow F downwards.

As can be seen in the vertical section of the FIG. 13, the second surface 6' is tilted towards the user, such that the air injected by the air blowing holes 8' is directed downwards.

Finally, it is preferred that the channels 12 corresponding to the holes 8' of the first 5' surface arranged closer to the lateral openings 3', 4' have a length greater than the remaining holes 11.

In this text, the word "comprises" and its variants (such as "comprising", etc.) should not be interpreted in an exclusive manner, that is, they do not exclude the possibility that what is described includes other elements, steps, etc.

On the other hand, the disclosure is not limited to the specific embodiments that have been described but also covers, for example, the variants that can be made by the average expert in the art (for example, as to the choice of materials, dimensions, components, configuration, etc.), within what is derived from the claims.

The invention claimed is:

1. A hand dryer comprising: a volume for receiving hands, the volume being delimited by two facing walls each provided with blow holes, an opening delimiting the volume by the superior and lateral sides of the volume, each wall being provided in their side opposed to the volume for receiving the hands with a fence delimiting a volume wherein pumped air is injected before its ejection by the holes, each one of the fences comprising an upper wall, two lateral walls and a lower wall, the hand dryer being provided with means for detecting an introduction of hands in the volume, wherein the detecting means comprise a capacitive detector made of a continuous conductive element which runs in the vicinity of the upper and lateral walls of one of the fences and wherein the continuous conductive element is arranged in the side of the fences opposite to the volume wherein blown air is injected before being ejected by the holes.

2. The hand dryer according to claim 1, comprising a second continuous conductive element which runs in the vicinity of the upper and lateral walls of the other fence.

3. The hand dryer according to claim 2, wherein the continuous conductive elements are cables.

4. The hand dryer according to claim 2, wherein the continuous conductive elements are a succession of cables and plates.

5. The hand dryer according to claim 2, wherein the continuous conductive elements are plates.

6. The hand dryer according to claim 3, wherein the walls comprise, adjacent to the fences and in the external face of the fences, cylindrical protrusions for attaching a complementary cover, the continuous conductive elements being pressed between the cylindrical protrusions and the fences.

7. The hand dryer according to claim 6, wherein the fences are provided on their external surface with stiffeners arranged in the vicinity of the cylindrical protrusions.

8. The hand dryer according to claim 1, wherein the continuous conductive elements are attached to the fences or to the internal surface of the walls and in the vicinity of the fences by means of protrusions specially dedicated and guides molded within each fence or a housing.

9. The hand dryer according to claim 2, wherein the continuous conductive elements are connected therebetween such that they constitute one of the conductive surfaces of the capacitive detector.

10. The hand dryer according to claim 1, further comprising a microcontroller configured for detecting a change in the capacitance of the capacitive detector higher than a determined threshold value.

11. The hand dryer according to claim 10, wherein the microcontroller is configured for detecting the change in the capacitance by measuring the charge and discharge times of the capacitive detector.

12. The hand dryer according to claim 2, wherein the continuous conductive elements are plates.

13. The hand dryer according to claim 1, wherein the walls comprise, adjacent to the fences and in the external face of the fences, cylindrical protrusions for attaching a complementary cover, the continuous conductive elements being pressed between the cylindrical protrusions and the fences.

\* \* \* \* \*